US007404980B2

(12) United States Patent
Blyablin et al.

(10) Patent No.: US 7,404,980 B2
(45) Date of Patent: Jul. 29, 2008

(54) METHOD FOR PRODUCING AN ADDRESSABLE FIELD-EMISSION CATHODE AND AN ASSOCIATED DISPLAY STRUCTURE

(76) Inventors: Alexandr Alexandrovich Blyablin, Ul. Ramenky 9-1-85, 117607 Moscow (RU); Alexandr Tursunovich Rakhimov, Rostovskaya Nab., 1-95, 119121 Moscow (RU); Vladimir Anatolievich Samorodov, Institutskaya Ul., 4-19, 143430 Moskovskaya Obl., Nakhabino (RU); Nikolaii Vladislavovich Suetin, Lenina, 20A-36, 144005 Elektrostal, PR. (RU)

( * ) Notice: Subject to any disclaimer, the term of this patent is extended or adjusted under 35 U.S.C. 154(b) by 501 days.

(21) Appl. No.: 10/220,003

(22) PCT Filed: Feb. 22, 2001

(86) PCT No.: PCT/RU01/00073

§ 371 (c)(1),
(2), (4) Date: Oct. 23, 2002

(87) PCT Pub. No.: WO01/63637

PCT Pub. Date: Aug. 30, 2001

(65) Prior Publication Data

US 2003/0143321 A1 Jul. 31, 2003

(51) Int. Cl.
*B05D 5/12* (2006.01)
*C23C 16/00* (2006.01)

(52) U.S. Cl. ........................ 427/77; 427/78; 427/249.1; 427/249.6; 427/249.8; 427/249.11

(58) Field of Classification Search .................. 427/58, 427/77, 78, 249.1, 249.6, 249.8, 249.11
See application file for complete search history.

(56) References Cited

U.S. PATENT DOCUMENTS 5,258,685 A * 11/1993 Jaskie et al. ................ 313/309

(Continued)

FOREIGN PATENT DOCUMENTS

JP 63-159292 * 7/1988

(Continued)

OTHER PUBLICATIONS

C.A.Spindt et al., J.Appl.Phys., 1976, vol. 47, p. 5248 (To Follow).
I. Brodie, P.R. Schwoebel, Proceedings of the IEEE, 1994, vol. 82, No. 7, p. 1006 (To Follow).

(Continued)

*Primary Examiner*—Brian K. Talbot
(74) *Attorney, Agent, or Firm*—Collard & Roe, P.C.

(57) ABSTRACT

The inventive method relates to microelectronic and consists in the application of an emission layer to elements of an addressable field-emission electrode with the aid of a gas-phase synthesis method in a hydrogen flow accompanied by a supply of a carbonaceous gas. A dielectric backing is made of a high-temperature resistant material and discrete elements of the addressable field-emission electrode are made of a high-temperature resistant metal. The growth rate of the emission layer on the dielectric backing is smaller than the growth rate of the emission layer on the metallic discrete elements as a result of a selected process of depositing the carbonaceous emission layer, namely the backing temperature, the temperature of the reactor threads, the pumping speed of a gas mixture through the reactor, a selected distance between the reactor threads and the backing and a settling time. The cathode metallic discrete elements can be made of two metallic layers. The upper metallic layer is removed before the formation of required configurations from the remaining layer. The layer materials are selected in such a way that the emission characteristics thereof can ensure a required current from the upper metallic layer. For producing a display structure, a control grid is obtained from the metal layer having an emission threshold higher than a field density at which the cathode emits the required current. The inventive method enables to avoid operations of removing the emission layer making it possible to produce flat displays having high characteristics in addition to high performance and low cost.

7 Claims, 3 Drawing Sheets

U.S. PATENT DOCUMENTS

| | | | | |
|---|---|---|---|---|
| 5,601,966 | A | 2/1997 | Kumar et al. | |
| 5,944,573 | A * | 8/1999 | Mearini et al. | 445/50 |
| 6,200,652 | B1 * | 3/2001 | Sun et al. | 427/573 |

FOREIGN PATENT DOCUMENTS

| | | | |
|---|---|---|---|
| RU | 2083018 | | 6/1997 |
| RU | 2118011 | | 8/1998 |
| WO | WO95/22169 | * | 8/1995 |
| WO | WO97/47020 | | 12/1997 |
| WO | WO 97/47020 | * | 12/1997 |

OTHER PUBLICATIONS

Chin-Maw Lin et al., Jpn.J.Appl.Phys., 1999, vol. 38 pp. 3700-3704 (To Follow).

Nalin Kumar, Howard Schmidt, Chenggang Xie, Solid State Technology, 1995, vol. 33, No. 5, pp. 71-74. (Enclosed).

* cited by examiner

METHOD FOR PRODUCING AN ADDRESSABLE FIELD-EMISSION CATHODE AND AN ASSOCIATED DISPLAY STRUCTURE

CROSS REFERENCE TO RELATED APPLICATIONS

Applicants claim priority under 35 U.S.C. §119 of Russian Application No. 2000104540 filed Feb. 25, 2000. Applicants also claims priority under 35 U.S.C. §365 of PCT/RU01/00073 filed Feb. 22, 2001. The international application under PCT article 21(2) was not published in English.

FIELD OF INVENTION

This invention pertains to microelectronics and, more specifically, to flat panel displays and other electro-vacuum devices on a basis of cold cathodes.

PRIOR ART

The methods are known of producing cold emission cathodes in form of tips made from silicon, molybdenum, or other conducting materials [C. A. Spindt et al., J.Appl.Phys., 1976, vol. 47, p.5248; I. Brodie, P. R. Schwoebel, Proceedings of the IEEE, 1994, vol. 82, no.7, p.1006; Chin-Maw Lin et al., Jpn.J.Appl.Phys., 1999, vol. 38, pp.3700-3704]. However the cathodes created by those methods are expensive and do not possess stability of their emission characteristics and technology of their production is difficult to scale-up.

Method is known of producing an addressable field-emission cathode comprising forming of a system of discrete alternating elements on a dielectric substrate made from high temperature material. The emitting elements are made in a form of discrete metallic elements which elements are made from a high temperature metal and which elements are applied on said dielectric substrate and coated with a carbon containing emission film [Nalin Kumar, Howard Schmidt, Chenggang Xie, Solid State Technology, 1995, vol. 33, no.5, pp.71-74]. The carbon containing emission film is an amorphous nanodiamond material deposited on the substrate by a method of laser sputtering. Since during laser sputtering the emission layer is deposited not only on the required locations at the substrate, separation of the emitting elements can be provided only via subsequent treatment using microelectronic technologies, e.g. lithography and etching. Shortcoming of it is that treatment of the deposited layer to selectively remove it or passivate its emission affects emission performances from all over the surface.

Method is known of producing a display structure with a triode control scheme [Nalin Kumar, Chenggang Xie, U.S. Pat. No. 5,601,966] comprising fabrication of field-emission cathodes. This method comprises fabrication of anode structure made in the form of parallel discrete elements, fabrication on a dielectric substrate made from a high temperature material of the discrete parallel metallic elements of addressable field-emission cathode which elements are perpendicular to the said discrete elements of the anode structure and made from high temperature metal and provided with the contact pads, and forming between the said addressable auto-emission cathode and the anode structure of a control grid. The control grid can be formed by any known lithographic method via deposition on the said metallic elements of the addressable field-emission cathode, but excluding the contact pads, of a layer of dielectric and layer of a metal, and then holes opening in the said metallic and dielectric layers in places of crossing of the discrete elements of the addressable field-emission cathode and anode structure which holes are formed of the required shape and penetrate down to the discrete elements of the addressable field-emission cathode. After that deposition of a carbon containing emission layer is made followed with its spatially selective removing to leave it only on the discrete elements of the cathode in hole openings.

SUMMARY OF THE INVENTION

The objective of the proposed invention is providing of a method which allows to exclude treatment of the deposited carbon containing emissive layer to selectively remove it or passivate its emission that affects emission performances along the whole surface.

The basis of the proposed invention is deposition of the carbon containing layer in such conditions which enable selective deposition thus completely avoiding the necessity of additional treatment.

The method of producing an addressable field-emission cathode comprises fabrication on a dielectric substrate of a structure of alternating discrete elements which elements are produced by deposition on said dielectric substrate that can be made from a high temperature material such as polycore, forsterite, sapphire, devitrified glass, anodized aluminum, quartz, silicon with oxidized upper layer, of the discrete metallic elements made from a high temperature metal such as molybdenum, titanium, tantalum, tungsten, hafnium, zirconium or their alloys, followed by deposition on them of the emissive layer. The carbon containing emissive layer is deposited by a method of gas phase synthesis comprising heating of metallic filaments and the substrate in a reactor in flow of hydrogen with admission of carbon containing gas into the said flow of hydrogen. Deposition takes place through a protective meshed screen. The deposition regime is selected to provide the growth rate of the emissive layer on the dielectric substrate substantially less than growth rate on the metallic discrete elements. For each particular pair of dielectric-metal a regime of deposition exists where the growth rate of the emissive layer on the dielectric substrate is substantially less than growth rate in the metallized areas. The metallic discrete elements can be made from two layers of metals and in this case the lower layer is made from a metal which electrical field strength threshold for beginning of emission is higher than electrical field strength at which the required current is emitted by the upper layer of metal. The upper metallic layer is partly removed to obtain the needed configuration from remaining part of the layer and then deposition of carbon containing emissive layer is carried out.

In case of the discrete metallic elements made of titanium on a dielectric substrate of devitrified glass, into the flow of hydrogen methane is admixed as the carbon containing gas, and deposition of the carbon containing emissive layer is carried out at methane concentration in the gas mixture of 1.5-2.5% at temperature of the dielectric substrate of 750-840° C., temperature of the metallic filaments of 2000-2070° C., gas mixture flow rate through reactor of 4-6 liters per hour, gap between the metallic filaments and substrate of 7-10 mm and gap between the protective meshed screen and substrate of 1-4 mm. Deposition time is 1-3 hours.

In case of the discrete metallic elements made of tantalum on a dielectric substrate of devitrified glass, into the flow of hydrogen methane is admixed as the carbon containing gas, and deposition of the carbon containing emissive layer is carried out at methane concentration in the gas mixture of 1.5-4% at temperature of the dielectric substrate of 900-950° C., temperature of the metallic filaments of 2150-2200° C., gas mixture flow rate through reactor of 4-6 liters per hour, gap between the metallic filaments and substrate of 7-10 mm and gap between the protective meshed screen and substrate of 1-4 mm. Deposition time is 1-3 hours.

In case of the discrete metallic elements made of molybdenum on a dielectric substrate of forsterite, into the flow of hydrogen methane is admixed as the carbon containing gas, and deposition of the carbon containing emissive layer is carried out at methane concentration in the gas mixture of 1.5-4% at temperature of the dielectric substrate of 900-950° C., temperature of the metallic filaments of 2150-2200° C., gas mixture flow rate through reactor of 4-6 liters per hour, gap between the metallic filaments and substrate of 7-10 mm and gap between the protective meshed screen and substrate of 1-4 mm. Deposition time is 1-3 hours.

Thus, due to proper selection of parameters and duration of deposition it is possible to produce the carbon containing emissive layer only in the metallized areas rather than on the dielectric substrate.

Method of producing an a display structure with triode control scheme comprises fabrication of anode structure made in the form of parallel discrete elements, fabrication on a dielectric substrate made from a high temperature material of the discrete parallel metallic elements of addressable field-emission cathode which elements are perpendicular to the said discrete elements of the anode structure and made from high temperature metal and provided with the contact pads. The metallic discrete elements of the addressable field-emission cathode can be made from two layers of metals and in this case the lower layer is made from a metal which electrical field strength threshold for beginning of emission is higher than electrical field strength at which the required current is emitted by the upper layer of metal. On the said discrete metallic elements, but excluding the contact pads, the layers are sequentially deposited of a dielectric and a metal which electrical field strength threshold for beginning of emission is higher than electrical field strength at which the required current is emitted by the cathode. After that a control grid is formed via holes opening in the said deposited metallic and dielectric layers in places of crossing of the discrete elements of the addressable field-emission cathode and anode structure, which holes are formed of the required shape and penetrate down to the discrete elements of the cathode. The metallic discrete elements of the cathode can be made from two layers of metals. Holes in the metallic and dielectric layers are opened down to the discrete elements of the cathode. From the said discrete elements of cathode the upper layer of the metal can be partly removed to obtain the needed patterns configuration at remaining part of the layer. It allows reduce probability of electrical breakdown along the wall between the emissive layer and control grid. The carbon containing emissive layer is formed on the said discrete elements of the cathode via deposition by a method of gas phase synthesis comprising heating of dielectric substrate and metallic filaments of the reactor in flow of hydrogen with admission of carbon containing gas into the said flow of hydrogen. The deposition regime is selected to provide the growth rate of the carbon containing emissive layer on the dielectric substrate substantially to be less than growth rate of the carbon containing emissive layer on the metallic layers. Said dielectric substrate can be made from a high temperature material such as polycore, forsterite, sapphire, devitrified glass, anodized aluminum, quartz, silicon with oxidized upper layer, and the metallic discrete elements are made from a high temperature metal such as molybdenum, titanium, tantalum, tungsten, hafnium, zirconium or their alloys.

On the dielectric substrate made of devitrified glass the discrete metallic elements of the addressable field-emission cathode are fabricated in a form of strips of titanium and these strips of titanium are coated with dielectric layer of anodized aluminum, and on this coating a metallic layer of zirconium is then further deposited. Holes of the required shape are opened then in the layers of zirconium and anodized aluminum, and deposition of the carbon containing emissive layer is carried out at methane concentration in the gas mixture of 1.5-2.5% at temperature of the dielectric substrate of 750-840° C., temperature of the metallic filaments of 2000-2070° C., gas mixture flow rate through reactor of 4-6 liters per hour, gap between the metallic filaments and substrate of 7-10 mm and gap between the protective meshed screen and substrate of 1-4 mm. Deposition time is 1-3 hours.

On the dielectric substrate made of silicon with oxidized upper layer the discrete metallic elements of the addressable auto-emission cathode are fabricated in a form of strips of titanium. The strips of titanium are coated with dielectric layer of silicon oxide, and on this coating a metallic layer of zirconium is then further deposited. Holes of the required shape are opened then in the layers of zirconium and silicon oxide. The deposition of the carbon containing emissive layer is carried out at methane concentration in the gas mixture of 1.5-2.5% at temperature of the dielectric substrate of 750-840° C., temperature of the metallic filaments of 2000-2070° C., gas mixture flow rate through reactor of 4-6 liters per hour, gap between the metallic filaments and substrate of 7-10 mm and gap between the protective meshed screen and substrate of 1-4 mm. Deposition time is 1-3 hours.

If carbon containing emissive layer is deposited using regime which parameters are outside of the limits specified above, the non-selective deposition of the emissive layer takes place along all over the substrate surface.

The required selectivity can't be provided if even one of the said parameters of deposition regime is outside of the said limits.

For example, a carbon containing emissive layer was deposited at temperature of the dielectric substrate of 900° C., temperature of the metallic filaments of 2150° C. and methane concentration of 3.5%. Deposition time was 1 hour. Selectivity was absent.

BRIEF DESCRIPTION OF DRAWINGS

The proposed methods are illustrated by a drawing where in the FIG. 1 a sequence of manufacturing steps to produce an addressable field-emission cathode is shown, and in the FIG. 2 a sequence of manufacturing steps to produce an addressable field-emission cathode is shown with making the discrete metallic elements of two layers, and in the FIG. 3 a sequence of manufacturing steps to produce a display structure.

EXAMPLES OF THE METHOD IMPLEMENTATION

EXAMPLE 1

Figure 1:
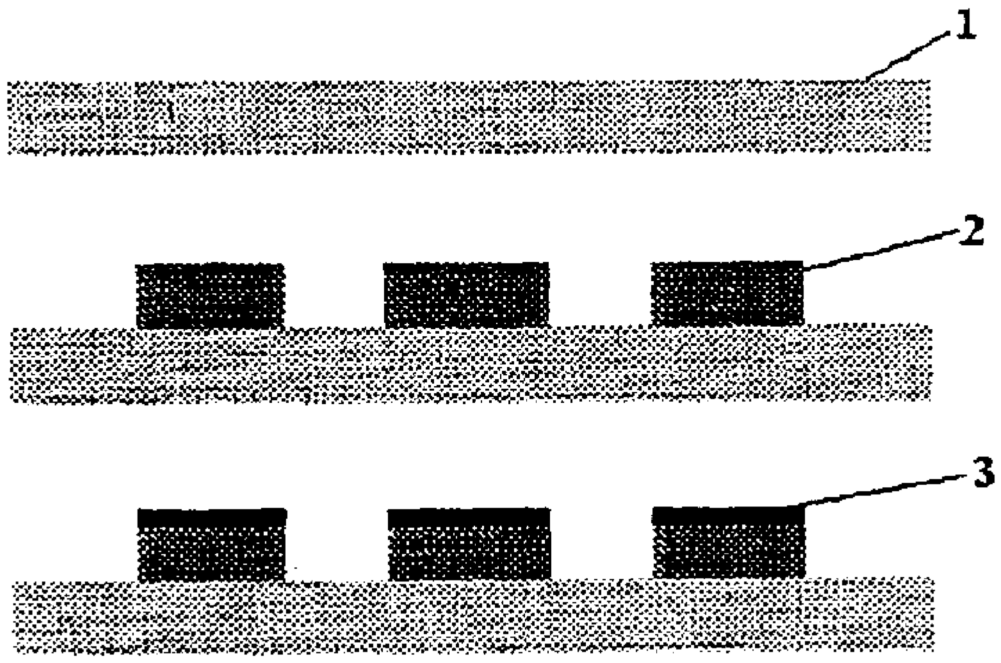
FIG. 1 sequentially shows deposition on a dielectric substrate (1) of the discrete metallic elements (2) and deposition of the emissive layer (3).
Figure 2:
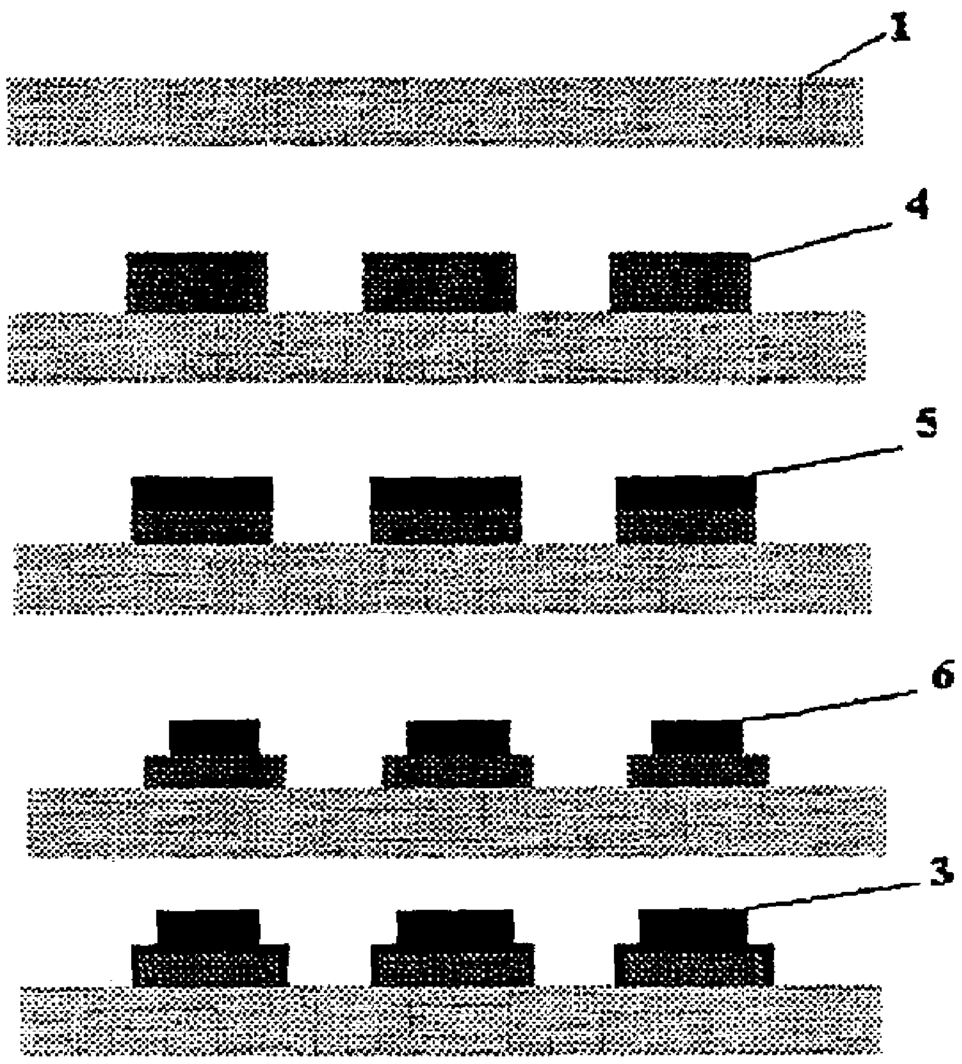
FIG. 2 sequentially shows deposition on a dielectric substrate (1) of the discrete metallic elements (2) consisting of a metallic layer (4) and metallic layer (5) selected to provide electrical field strength threshold for beginning of emission from lower metallic layer (4) is higher than electrical field strength at which the required current is emitted by the upper layer of metal (5), configuring a pattern (6) by partly removing of metal (5), and deposition of the emissive layer (3).
Figure 3:
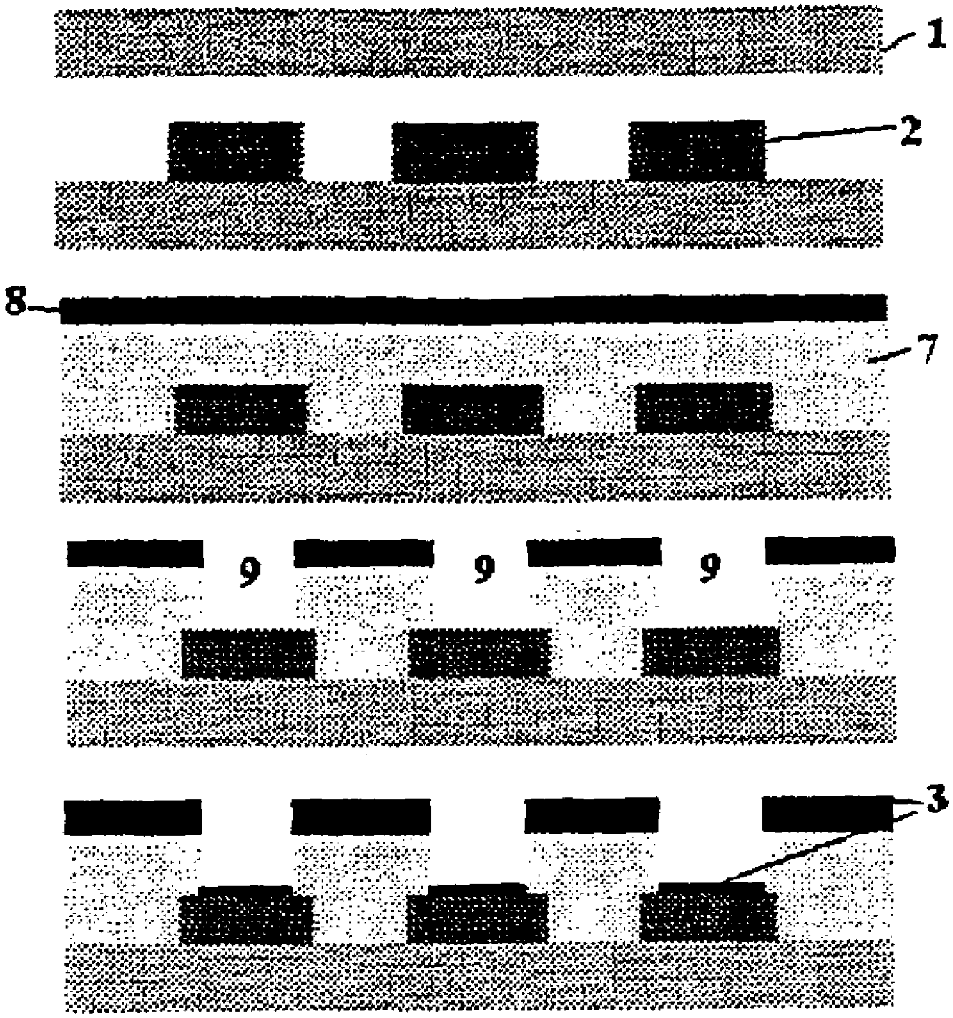
FIG. 3 sequentially shows deposition on a dielectric substrate (1) of the discrete metallic elements (2), deposition of dielectric layer (7), metallic layer (8) selected to provide electrical field strength threshold for beginning of emission from which is higher than electrical field strength at which the required current is emitted by the cathode, opening in the said metallic layer (8) of holes (9) down to metal (5), and deposition of the emissive layer (3).

On a dielectric substrate (1) of polished devitrified glass 500 microns thick the discrete metallic elements (2) of titanium were fabricated in a form of strips of 20, 40, 60, 80, 100, 125, 150, 200, 250, 300, 400 microns by width with 800×800 microns contact pads via a standard lithographical process from a layer of 700-800 Angstroms thick. Deposition of carbon containing emissive layer (3) was carried out at the following process parameters: methane concentration in the gas mixture—1.8%, temperature of the dielectric substrate—800° C., temperature of the metallic filaments of the reactor—2030° C., gas mixture flow rate through reactor—4-6 liters per hour, gap between the metallic filaments of the reactor and dielectric substrate—7-10 mm and gap between the protective meshed screen and dielectric substrate—1-4 mm. Deposition time was 2 hours. Electrical resistance between the elements is several MOhms. The method makes possible independent addressing of lines made with a resolution of about 10 microns. Such resolution is sufficient even for miniature displays of high resolution.

EXAMPLE 2

On a dielectric substrate (1) of devitrified glass 500 microns thick the discrete metallic elements (2) of tantalum were fabricated from a layer of 700-800 Angstroms thick. Deposition regimes providing selective deposition of carbon containing emissive layer (3) are as follows: temperature of the dielectric substrate—930° C., temperature of the metallic filaments of the reactor—2160° C., methane concentration—1.8%, gas mixture flow rate through reactor—4-6 liters per hour. Deposition time—2 hours. High selectivity was achieved. One should note that similar result can also be obtained in case if initially tantalum is deposited in the form of tantalum oxide what technologically is often more suitable. During deposition the oxide reduces and the deposited metallization has sufficient conductivity.

EXAMPLE 3

On a dielectric substrate (1) forsterite the discrete metallic elements (2) of molybdenum were fabricated 10 microns thick from a paste via screen-printing technique. Deposition regimes providing selective deposition of carbon containing emissive layer (3) on molybdenum are as follows: temperature of the dielectric substrate—950° C., temperature of the metallic filaments of the reactor—2180° C., methane concentration~3.5%, gas mixture flow rate through reactor—4-6 liters per hour. Deposition time—2 hours. Selectivity of deposition of the carbon containing emissive layer (3) was achieved that do not need further treatment of the auto-emission cathode.

EXAMPLE 4

On a dielectric substrate (1) of devitrified glass the discrete metallic elements (2) of titanium were fabricated in a form of strips of 2 mm by width and 800 Angstroms thick via standard lithographical techniques. After that the dielectric substrate (1) with discrete metallic elements (2) deposited onto it, but excluding the contact pads, was coated with dielectric layer (7) of about one micron thick made of anodized aluminum. On top of it a metallic layer (8) of 600 Angstroms thick of zirconium was deposited. In these layers the holes (9) were opened penetrating down to layer of titanium. The holes diameter was 20 microns and spacing between holes was 35 microns. After that on thus fabricated structure the deposition of carbon containing emissive layer (3) was carried out at the following process parameters: methane concentration in the gas mixture of 1.5-2.5% at temperature of the dielectric substrate of 750-840° C., temperature of the metallic filaments of 2000-2070 ° C., gas mixture flow rate through reactor of 4-6 liters per hour, gap between the metallic filaments and substrate of 7-10 mm and gap between the protective meshed screen and substrate of 1-4 mm. Deposition time is 1-3 hours.

EXAMPLE 5

On a dielectric substrate (1) in the form of a silicon wafer coated with oxide layer a layer of titanium of 900 Angstroms thick was deposited by magnetron sputtering. The discrete metallic elements (2) of titanium were then fabricated in a form of strips of 1 mm by width and 800 Angstroms thick via standard lithographical techniques. After that the dielectric substrate (1) with discrete metallic elements (2) deposited onto it, but excluding the contact pads, was coated with layer of silicon oxide of 0.5 microns thick performing the role of the dielectric layer (7). On top of it a metallic layer (8) of 700 Angstroms thick of zirconium was deposited. In the layers of zirconium and dielectric the holes (9) were opened penetrating down to cathode strips of titanium. The holes diameter was 12 microns and spacing between holes was 30 microns. After that on thus fabricated structure the deposition of carbon containing emissive layer (3) was carried out at the following process parameters: methane concentration in the gas mixture of 1.5-2.5% at temperature of the dielectric substrate of 750-840° C., temperature of the metallic filaments of 2000-2070° C., gas mixture flow rate through reactor of 4-6 liters per hour, gap between the metallic filaments and substrate of 7-10 mm and gap between the protective meshed screen and substrate of 1-4 mm. Deposition time is 1-3 hours.

It was determined that emission thresholds of the carbon containing emissive layer deposited by the proposed method on different metals pronouncedly differ what allows to use materials with high emission threshold value to fabricate addressing metallization and ones with lower threshold—to selectively produce emission. It was employs in a display screen structure. Materials with higher emission threshold can be used as material for control grid for addressing metallization, and ones with lower threshold—as material to fabricate emissive film.

Data obtained via phosphor luminescence technique demonstrated high spatial selectivity of electrons emission distribution along the surface of deposited carbon containing emissive layer (resolution is better than 20 microns). The achieved electrical current density exceeded 100 mA/sq.cm, concentration of emission centers exceeded $10^6$ per sq.cm. These data obtained via phosphor luminescence technique demonstrated that distribution of the electrons emission from the surface of triode structures corresponds to perforation areas (i.e. areas of holes opened in the structure). Thus, all needed parameters are implemented that are required to create a flat panel display due to selective deposition of the carbon containing emissive layer.

APPLICABILITY IN INDUSTRY

Method allows manufacturing of flat panel displays possessing high performances at high productivity and low cost due to selectivity of deposition what allows to avoid etching of the emissive layer.

The invention claimed is:

1. Method of producing a display structure with triode control scheme comprising fabrication of anode structure made in the form of parallel discrete elements, fabrication on a dielectric substrate made from a high temperature material of the discrete parallel metallic elements of addressable field-emission cathode which elements are perpendicular to the said discrete elements of the anode structure and made from high temperature metal and provided with the contact pads, fabrication of a control grid placed between the addressable field-emission cathode and anode structure via deposition on the said discrete metallic elements of the addressable field-emission cathode, but excluding the contact pads, of a layer of dielectric and layer of a metal, opening the holes in the said layer of dielectric and said layer of metal above deposited discrete metallic elements in places of crossing of the discrete elements of the addressable field-emission cathode and anode structure, which holes are formed of the required shape and penetrate down to the discrete elements of the cathode, deposition of a carbon containing emissive layer, wherein on the dielectric layer a layer of metal is deposited which electrical field strength threshold for beginning of emission is higher than electrical field strength at which the required current is emitted by the cathode, and the carbon containing emissive layer is deposited on the said discrete elements of the addressable field-emission cathode via method of gas phase synthesis comprising heating of metallic filaments of the reactor and the dielectric substrate in the reactor in flow of hydrogen with admission of carbon containing gas into the said flow, conducting deposition through a protective meshed screen, and selecting deposition regime to provide growth rate of the carbon containing emissive layer on the dielectric substrate being substantially less than growth rate of the carbon containing emissiVe layer on the discrete metallic elements of the addressable auto-emission cathode, and said deposition regime is selected from the group consisting of concentration of the carbon containing gas, temperature of the dielectric substrate, temperature of the metallic filaments, gas mixture flow rate, gap between the metallic filament of the reactor and of the substrate, gap between the protective meshed screen and the substrate, and duration of the deposition.

2. Method of claim 1, wherein the discrete metallic elements of the addressable field-emission cathode are made from two layers of metals and the lower layer is made from a metal which electrical field strength threshold for beginning of emission is higher than electrical field strength at which the required current is emitted by the upper layer of metal, and opening of holes in said layers of dielectric and above deposited metal, which holes are formed of the required shape and penetrate down to the upper layer of the metal of said discrete elements of the addressable field-emission cathode.

3. Method of claim 2, wherein after opening the holes in said layers of dielectric and above deposited metal the upper layer of metal is partly removed from the said discrete elements of the addressable field-emission cathode to obtain the needed patterns configuration at remaining part of the upper layer.

4. Method of claim 1, wherein the said discrete metallic elements of the addressable field-emission cathode are fabricated on a dielectric substrate made from a high temperature material comprising polycore, forsterite, sapphire, devitrified glass, anodized aluminum, quartz or silicon with oxidized upper layer.

5. Method of claim 1, wherein on a dielectric substrate the discrete metallic elements of the addressable field-emission cathode are deposited made from a high temperature metal comprising molybdenum, titanium, tantalum, tungsten, hafnium, zirconium or their alloys.

6. Method of claim 1, wherein on a dielectric substrate made of devitrified glass the discrete metallic elements of the addressable field-emission cathode are fabricated which elements are made in form of titanium strips, on these titanium strips a dielectric layer of anodized aluminum is then deposited, which dielectric layer is further coated with a metallic layer of zirconium, the holes are then opened in said layers of zirconium and anodized aluminum, and deposition of the carbon containing emissive layer is carried out at methane conceVitration in the hydrogen flow of 1.5-2.5%, temperature of the dielectric substrate of 750-840° C., temperature of the metallic filaments of the reactor of 2000-2070° C., gas mixture flow rate through reactor of 4-6 liters per hour, gap between the metallic filaments of the reactor and substrate of 7-10 mm and gap between the protective meshed screen and substrate of 1-4 mm, and deposition process continues during 1-3 hours.

7. Method of claim 1, wherein on a dielectric substrate made of silicon with oxidized upper layer the discrete metallic elements of the addressable field-emission cathode are fabricated which elements are made in form of titanium strips, on these titanium strips a dielectric layer of silicon oxide is then deposited, which dielectric layer is further coated with a metallic layer of zirconium, the holes are then opened in said layers of zirconium and silicon oxide, and deposition of the carbon containing emissive layer is carried out at methane concentration in the hydrogen flow of 1.5-2.5%, temperature of the dielectric substrate of 750-840° C., temperature of the metallic filaments of the reactor of 2000-2070° C., gas mixture flow rate through reactor of 4-6 liters per hour, gap between the metallic filaments of the reactor and substrate of 7-10 mm and gap between the protective meshed screen and substrate of 1-4 mm, and deposition process continues during 1-3 hours.

* * * * *

UNITED STATES PATENT AND TRADEMARK OFFICE

CERTIFICATE OF CORRECTION

PATENT NO. : 7,404,980 B2
APPLICATION NO. : 10/220003
DATED : July 29, 2008
INVENTOR(S) : Blyablin et al.

It is certified that error appears in the above-identified patent and that said Letters Patent is hereby corrected as shown below:

Title page, item [86], please change the §371 date from "October 23, 2002" to correctly read: --December 23, 2002--.

Signed and Sealed this

Fourteenth Day of October, 2008

JON W. DUDAS
*Director of the United States Patent and Trademark Office*